US008143916B2

(12) United States Patent
Funakoshi (10) Patent No.: US 8,143,916 B2
(45) Date of Patent: Mar. 27, 2012

(54) LEVEL SHIFT CIRCUIT, METHOD FOR DRIVING THE SAME, AND SEMICONDUCTOR CIRCUIT DEVICE HAVING THE SAME

(75) Inventor: Jun Funakoshi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 72 days.

(21) Appl. No.: 12/479,221

(22) Filed: Jun. 5, 2009

(65) Prior Publication Data

US 2009/0243697 A1    Oct. 1, 2009

Related U.S. Application Data

(63) Continuation of application No. PCT/JP2006/324519, filed on Dec. 8, 2006.

(51) Int. Cl.
*H03K 19/0175* (2006.01)
*H03L 5/00* (2006.01)
(52) U.S. Cl. ............................. 326/68; 326/63; 327/333
(58) Field of Classification Search .................. 326/62, 326/63, 68, 80–81; 327/333
See application file for complete search history.

(56) References Cited

U.S. PATENT DOCUMENTS

| 6,275,070 B1 * | 8/2001 | Pantelakis et al. ............... 326/98 |
| 7,352,209 B2 * | 4/2008 | Hsu et al. ......................... 326/81 |
| 2005/0206640 A1 | 9/2005 | Miyamoto et al. |

FOREIGN PATENT DOCUMENTS

| JP | 05-308274 A | 11/1993 |
| JP | 10-163854 A | 6/1998 |
| JP | 10-336007 A | 12/1998 |
| JP | 2005-266043 A | 9/2005 |
| JP | 2005-286675 A | 10/2005 |
| JP | 2006-229526 A | 8/2006 |

* cited by examiner

*Primary Examiner* — Shawki S Ismail
*Assistant Examiner* — Thienvu Tran
(74) *Attorney, Agent, or Firm* — Arent Fox LLP (57) ABSTRACT

A level shift circuit includes a level shift section for receiving a low potential signal oscillating between a high potential and a ground potential and converting it into a high potential signal oscillating between the high potential and the ground potential, the level shift section being connected to at least a high potential power supply for generating the high potential, a low potential power supply for generating the low potential, and a ground power supply for generating the ground potential, an inverter section for inverting-amplifying the high potential signal from the level shift section, and an N-type MOS transistor for supplying the ground potential to the inverter section, the N-type MOS transistor being connected in series to the inverter section between the high potential power supply and the ground power supply and having its gate electrode connected to the low potential power supply.

9 Claims, 5 Drawing Sheets

LEVEL SHIFT CIRCUIT, METHOD FOR DRIVING THE SAME, AND SEMICONDUCTOR CIRCUIT DEVICE HAVING THE SAME

CROSS REFERENCE TO RELATED APPLICATION

This application is based upon and claims the benefit of priority from the prior International Application NO. PCT/JP2006/324519 filed on Dec. 8, 2006, the entire contents of which are incorporated herein by reference.

FIELD

The embodiments discussed herein are related to a level shift circuit, a method for driving the level shift circuit, and a semiconductor circuit device having the level shift circuit and, more particularly, to a level shift circuit, a method for driving the level shift circuit, and a semiconductor circuit device having the level shift circuit which prevents a surplus current from flowing regardless of power-on-sequences.

BACKGROUND

If a so-called system LSI, in which an analog circuit and a digital circuit are combined, contains a plurality of power supply systems, such as an analog power supply and a logic power supply, power-on-sequences are specified in the specifications for such a system LSI.

Following power-on-sequences other than that specified causes a transient surplus current to flow in a circuit.

For example, in a system LSI that drives a circuit operating on an analog power supply with a signal from a circuit operating on a logic power supply, the level of the signal from the circuit operating on the logic power supply becomes indefinite for a period of time between turning on of the analog power supply and turning on of the logic power supply. For this reason, in the circuit operating on the analog power supply, a MOS transistor receiving a signal from the circuit operating on the logic power supply experiences a surplus current flow due to an indefinite gate voltage, resulting in the increased drainage of batteries that drive the above system LSI.

Consequently, focusing on a level shift circuit that receives a logic signal and outputs a signal to an analog circuit, it is conceivable that the level of an output signal from the level shift circuit is prevented from becoming indefinite for a period of time between turning-on of the analog power supply and turning-on of the logic power supply.

For example, Japanese Laid-open patent Publication No. 10-336007 describes a level shift circuit that couples an analog power supply with a node in the level shift circuit by capacitive coupling, thereby fixing, in conjunction with turning on of the analog power supply, the potential at a node which is expected to cause the level shift circuit to be at an indefinite potential. Also, Japanese Laid-open patent Publication No 10-163854 describes a level shift circuit that couples, by capacitive coupling, an analog power supply or a ground power supply with a former-stage node in an output buffer constituting the level shift circuit, thereby fixing the potential at the above-described former-stage node in conjunction with turning on of the analog power supply.

In the above-described level shift circuit, a node potential is fixed by capacitive coupling. Accordingly, it takes time to cause electric charge to be built up in the capacitance until the node potential is fixed after an analog power supply is turned on.

Particularly focusing on an output buffer that constitutes a level shift circuit and drives a load connected to the level shift circuit for a period of time until a node potential in the level shift circuit is fixed, the level of a signal from the output buffer in the level shift circuit becomes indefinite until the potential at a former-stage node in the output buffer becomes fixed.

Consequently, a surplus current flows in the level shift circuit and the analog circuit during a period of time from when a node potential in the level shift circuit is not fixed after an analog power supply is turned on, until a logic power supply is turned on.

In other words, a penetrating current flows in a P-type MOS transistor and an N-type MOS transistor which constitute the output buffer in the level shift circuit, resulting in occurrence of a surplus current flow.

Since the analog circuit that operates with a signal from the above output buffer is subjected to an indefinite level signal, a MOS transistor subjected to such an indefinite signal in the analog circuit experiences a penetrating current flow, resulting in occurrence of a surplus current.

SUMMARY

According to an aspect of the embodiments, a level shift circuit includes a level shift section for receiving a low potential signal oscillating between a high potential and a ground potential and converting it into a high potential signal oscillating between the high potential and the ground potential, the level shift section being connected to at least a high potential power supply for generating the high potential, a low potential power supply for generating the low potential, and a ground power supply for generating the ground potential, an inverter section for inverting-amplifying the high potential signal from the level shift section, and an N-type MOS transistor for supplying the ground potential to the inverter section, the N-type MOS transistor being connected in series to the inverter section between the high potential power supply and the ground power supply and having its gate electrode connected to the low potential power supply.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

DESCRIPTION OF THE PREFERRED EMBODIMENTS

The present invention will now be described below in terms of Embodiments 1, 2, and 3.

Embodiment 1

Embodiment 1 is a level shift circuit connected to at least two types of power supplies and a ground potential power supply, which prevents a penetrating current from flowing in an inverter section constituting the level shift circuit, regardless of power-on-sequences of the power supplies.

Embodiment 1 is described with reference to FIGS. 1, 2, and 3.

Level Shift Circuit

Figure 1:
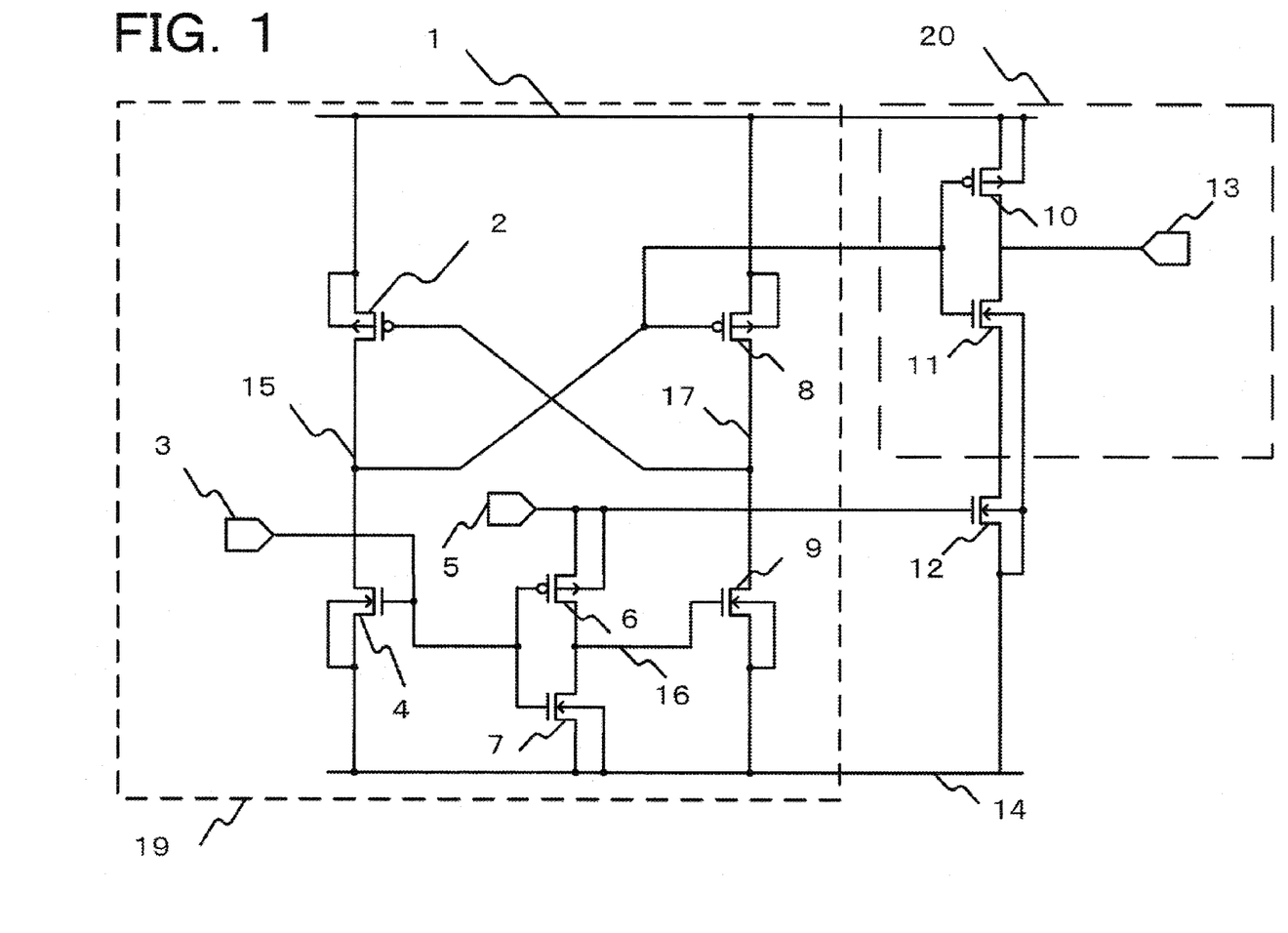
FIG. 1 is a level shift circuit according to Embodiment 1.

FIG. 1 shows a level shift circuit. The level shift circuit according to Embodiment 1 includes a level shift section 19 consisting of a P-type MOS transistor 2 connected to a high potential power supply 1, an input terminal 3, an N-type transistor 4 connected to a ground potential power supply 14, a P-type MOS transistor 6 connected to a low potential power supply 5, an N-type MOS transistor 7 connected to the ground potential power supply 14, a P-type MOS transistor 8 connected to the high potential power supply 1, and an N-type MOS transistor 9 connected to the ground potential power supply 14, an inverter section 20 consisting of a P-type MOS transistor 10 connected to the high potential power supply 1, an N-type MOS transistor 11, and an output terminal 13, and an N-type MOS transistor 12 connected to the ground potential power supply 14 for supplying a ground potential to the inverter section 20.

The level shift circuit 19 operates as a latch type circuit that latches a high potential signal corresponding to a low potential signal inputted from the input terminal 3. The low potential signal refers to a signal that oscillates between a low potential level and a high potential level. Also, the high potential signal refers to a signal that oscillates between a high potential level and a ground potential level.

The P-type MOS transistor 2 in the level shift section 19 has its source connected to the high potential power supply 1, its drain connected to a node 15, its gate connected to a node 17, and its back gate connected to the high potential power supply 1.

The N-type MOS transistor 4 has its source connected to the ground potential power supply 14, its drain connected to the node 15, its gate connected to the input terminal 3, and its back gate connected to the low potential power supply 14. In other words, the P-type MOS transistor 2 and the N-type MOS transistor 4 are connected in series between the high potential power supply 1 and the ground potential power supply 14.

The P-type MOS transistor 8 in the level shift section 19 has its source connected to the high potential power supply 1, its drain connected to the node 17, its gate connected to the node 15, and its back gate connected to the high potential power supply 1.

The N-type MOS transistor 9 has its source connected to the ground potential power supply 14, its drain connected to the node 17, its gate connected to a node 16, and its back gate connected to the ground potential power supply 14. In other words, the P-type MOS transistor 8 and the N-type MOS transistor 9 are connected in series between the high potential power supply 1 and the ground potential power supply 14.

The gate electrode of the P-type MOS transistor 2 is connected to the drain of the P-type MOS transistor 8, while the gate electrode of the P-type MOS transistor 8 is connected to the drain of the P-type MOS transistor 2, providing a so-called cross connection.

The P-type MOS transistor 6 in the level shift section 19 has its source connected to the low potential power supply 5, its drain connected to the node 16, its gate connected to the input terminal 3, the gate of the P-type MOS transistor 7, and the gate of the P-type MOS transistor 4, and its back gate connected to the low potential power supply 5.

The N-type MOS transistor 7 has its source connected to the ground potential power supply 14, its drain connected to the node 16, its gate connected to the input terminal 3, the gate of the P-type MOS transistor 6, and the gate of the N-type MOS transistor 4, and its back gate connected to the low potential power supply 5. A signal inputted to the input terminal 3 is a low potential signal that oscillates between the low potential level and the ground potential level.

Accordingly, the P-type MOS transistor 6 and the N-type MOS transistor 7 form a logic inverting circuit, causing a signal from the input terminal 3 connected to the gate of the N-type MOS transistor 4 to be logically inverted and be sent to the gate of the N-type MOS transistor 9, Accordingly, a signal outputted to the node 16 is a low potential signal that oscillates between the low potential level and the ground potential level.

As a result, a logically inverted version of a signal from the terminal 3 is generated at the node 15, and the signal is maintained.

Also, a logically inverted version of a signal transmitted to the gate of the N-type MOS transistor 9 is generated at the node 17, and the signal is maintained. This is because the gate electrodes of the P-type MOS transistor 2 and the P-type MOS transistor 8 are cross-connected to the respective drains thereof, thereby constituting a latch circuit.

Signals at the node 15 and the node 17 are high potential signals that oscillate between the high potential level resulting from the high potential power supply 1 and the ground potential level resulting from the ground potential power supply 14.

The inverter section 20 operates as an inverting amplifying circuit. In the inverter section 20, the P-type MOS transistor 10 has its source connected to the high potential power supply 1, its gate connected to the node 15, its drain connected to the output terminal 13, and its back gate connected to the high potential power supply 1.

In the inverter section 20, the N-type MOS transistor 11 has its source connected to a node 18, its gate connected to the node 15, its drain connected to the output terminal 13, and its back gate connected to the ground potential power supply 14.

Accordingly, the inverter 20 inverting-amplifies a signal from the node 15 and outputs it to the output terminal 13. The signal outputted to the output terminal 13 is a high potential signal that oscillates between the high potential level resulting from the high potential power supply 1 and a ground potential level resulting from the ground potential power supply 14.

An N-type MOS transistor operates as a switch. The N-type MOS transistor 12 has its source connected to the ground potential power supply 14, its gate connected to the low potential power supply 5, its drain connected to the node 18, and its back gate connected to the ground potential power supply 14. Accordingly, if the low potential power supply 5 is at a ground potential, a potential at the node 18 is at an intermediate potential between the low potential and the high potential since the N-type MOS transistor 12 does not supply a ground potential to the inverter section 20. In contrast, if the low potential power supply 5 is at the low potential, a potential at the node 18 is at the low potential since the N-type MOS transistor 12 supplies the ground potential to the inverter section 20.

<Operation of the Level Shift Circuit when the High Potential Power Supply is Turned on First>

Figure 2:
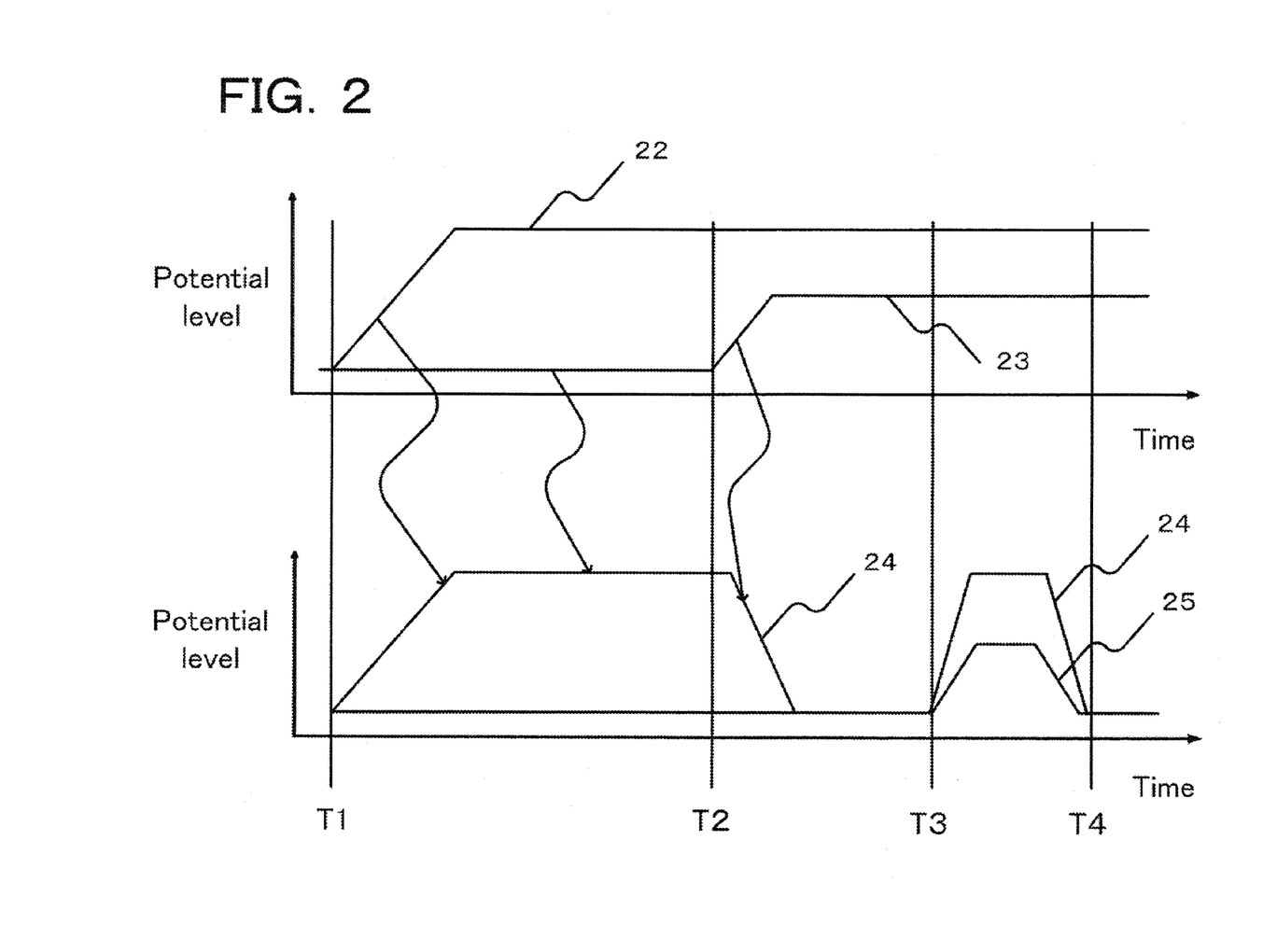
FIG. 2 is a waveform diagram showing power-on-sequences, and a waveform diagram of an input signal inputted to an input terminal 3 and an output signal outputted from an output terminal 13.

FIG. 2 is a waveform diagram showing power-on-sequences, and a waveform diagram of an input signal inputted to the input terminal 3 and an output signal outputted from the output terminal 13.

The waveform showing power-on-sequences in which the high potential power supply is turned on first depicts how a potential 22 of the high potential power supply 1 and a change in a potential 23 of the low potential power supply 5 change as time elapses.

The potential 22 of the high potential power supply 1 rises to a high potential, for example, 3.0V at a time T1 and thereafter the potential is maintained at that level.

The potential 23 of the low potential power supply 5 rises to a low potential, for example, 1.8V at a time T2 later than the time T1 and thereafter the potential is maintained at that level.

The waveform diagram of a signal shows how a potential 24 of an output signal and a potential 25 of an input signal change as time elapses. A signal outputted from the output terminal 13 rises to a high potential, for example, 3.0V as the potential of the high potential power supply 1 rises at the time T1. In addition, the signal outputted from the output terminal 13 varies with an input signal from the input terminal 3 as the potential of the low potential power supply 5 rises at the time T2. For example, if the input signal from the input terminal 3 is at the ground potential level, the output signal from the output terminal 13 is also at the ground potential level. Furthermore, if the input signal rises to the low potential level from the ground potential level at a time T3 and falls to the ground potential level at a time T4, the output signal accordingly rises to the high potential level at the time T3 and falls to the ground potential level at the time T4.

The reason why the output signal from the output terminal 13 exhibits the high potential level for a period of time between the times T1 and T2 is as follows;

An assumption is made that the potential of the high potential power supply 1 rises toward a high potential at the time T1 when the input signal to the input terminal 3 is at the ground potential level, the low potential power supply 5 is at the ground potential level, and the high potential power supply 1 is at the ground potential level.

Under the assumption, the N-type MOS transistors 4, 9 are turned off since the input signal inputted to the input terminal 3 and the node 16 remains at the ground potential level. As a result, the node 15 and the node 17 enter a floating state. A parasitic capacity of the node 17 consists of only the gate capacity of the P-type MOS transistor 2, while the parasitic capacity of the node 15 consists of the gate capacity of the P-type MOS transistor 8 and the MOS transistors in the inverter section 20, which means that the node 15 has a greater parasitic capacity. Consequently, the high potential power supply 1 rising to a high potential causes the node 17 to have a high potential first, resulting in the P-type transistor 2 becoming off. This leads to the potential of the node 15 becoming an intermediate potential between the ground potential and the high potential, which is close to the ground potential. As a result, the P-type MOS transistor 10 in the inverter section 20 becomes on, causing an output signal having a high potential to be outputted to the output terminal 13. Since the N-type MOS transistor 12 for supplying the ground potential to the inverter section 20 becomes off, no penetrating current flows in the inverter section 20.

When the low potential power supply 5 rises toward the low potential at the time T2, a potential at the node 16 becomes a low potential. This is because the input signal being at the ground potential is inverting-amplified and outputted to the node 16. As a result, the potential of the node 17 becomes the ground potential, resulting in the node 15 having the high potential. This causes a signal having the ground potential to be outputted to the output terminal 13.

After a potential at each node becomes definite as described above, the inverted signal of an input signal from the input terminal 3 is outputted to the node 16 depending on whether such an input signal has the ground potential or the low potential. This causes the node 15 to have a signal at the ground potential occurring when the input signal is at the low potential level, and a signal at the high potential signal occurring when the input signal is at the ground potential level. As a result, a signal having the same phase as, but a different amplitude from, the input signal from the input terminal 3 is outputted from the output terminal 13.

<Operation of the Level Shift Circuit when the Low Potential Power Supply is Turned on First>

Figure 3:
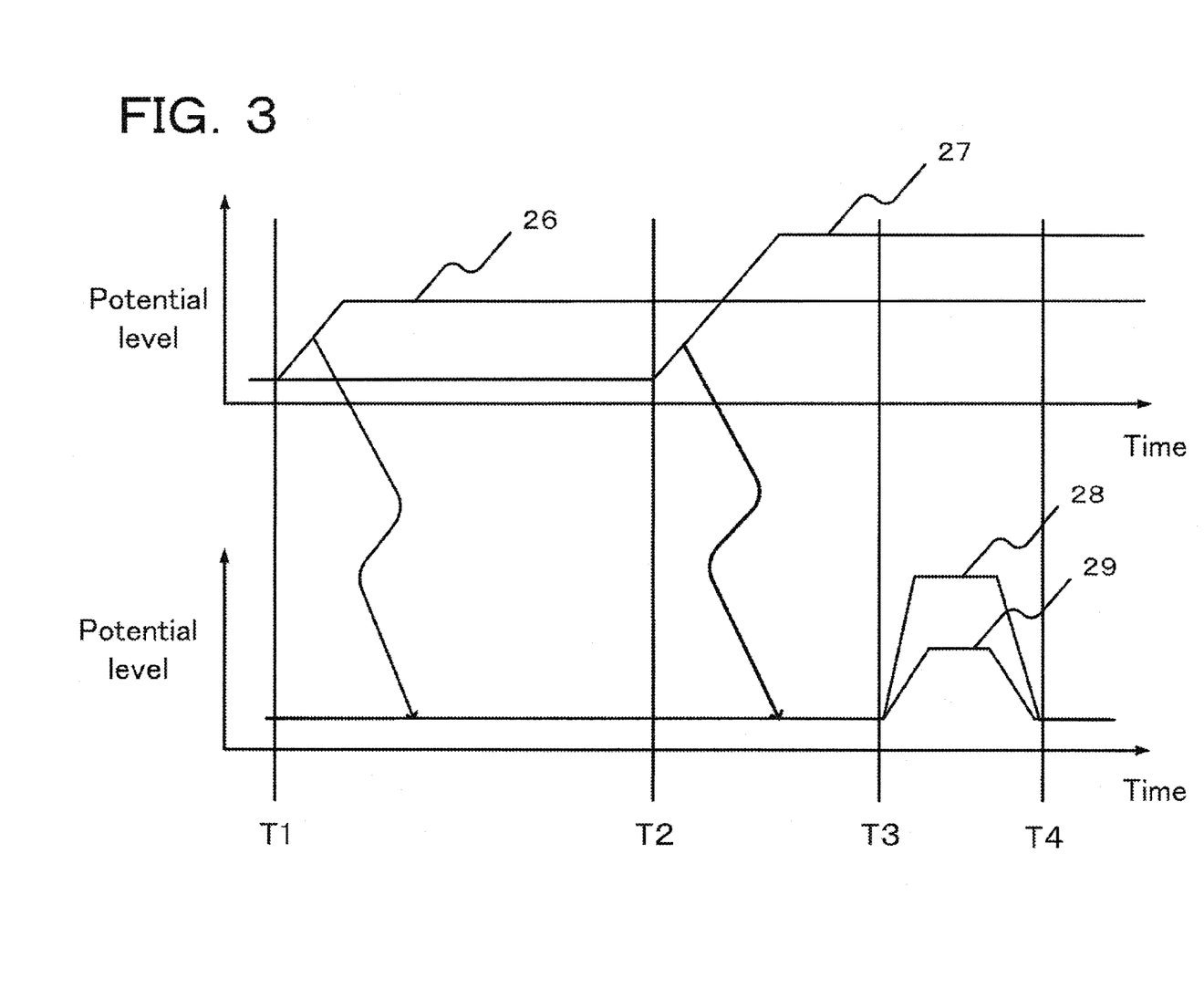
FIG. 3 is a waveform diagram showing power-on-sequences, and a waveform diagram of an input signal inputted to an input terminal 3 and an output signal outputted from an output terminal 13.

FIG. 3 is a waveform diagram showing power-on-sequences, and a waveform diagram of an input signal inputted to the input terminal 3 and an output signal outputted from the output terminal 13.

The waveform showing power-on-sequences in which the low potential power supply is turned on first depicts how a potential 27 of the high potential power supply 1 and a potential 26 of the low potential power supply 5 change as time elapses.

The potential 25 of the low potential power supply 5 rises to a low potential, for example, 1.8V at a time T1 and thereafter the potential is maintained at that level.

The potential 26 of the high potential power supply 1 rises to a high potential, for example, 3.0V at a time T2 later than the time T1 and thereafter the potential is maintained at that level.

The waveform diagram of a signal shows how a potential 28 of an output signal and a potential 29 of an input signal change as time elapses. After the low potential power supply 5 rises at the time T1, a signal outputted from the output terminal 13 is at the ground potential level. Then, after the high potential power supply 1 rises at the time T2, the signal outputted from the output terminal 13 is also at the ground potential level. Subsequently, after the input signal from the input terminal 3 is at the ground potential level, the signal outputted from the output terminal 13 is also at the ground potential level. Furthermore, if the input signal rises to the low potential level from the ground potential level at a time T3 and falls to the ground potential level at a time T4, for example, the output signal accordingly rises to the high potential level at the time T3 and falls to the ground potential level at the time T4.

The reason why the output signal from the output terminal 13 exhibits the high potential level for a period of time between the times T1 and T2 is as follows;

An assumption is made that the potential of the low potential power supply 5 rises toward a low potential at the time T1 when the input signal to the input terminal 3 is at the ground potential level, the low potential power supply 5 is at the ground potential level, and the high potential power supply 1 is at the ground potential level.

Under such an assumption, a signal at the input terminal 3 is at the ground potential, while the node is at the low potential, causing the N-type MOS transistor 4 and the N-type MOS transistor 9 to become off and on, respectively. As a result, the node 15 enters a floating state, while the node 17 has the ground potential. The high potential power supply 1 has not yet risen as of the time T1. Consequently, the node 15 has the ground potential. However, since the high potential power supply 1 for supplying the high potential to the inverter section 20 does not rise, the output terminal 13 has the ground potential, regardless of the status of the P-type MOS transistor in the inverter section 20. In addition, although the N-type MOS transistor is in an on state, no penetrating current flows in the inverter section 20.

When the high potential power supply 1 rises toward the high potential at the time T2, the node 15 has the high potential due to the node 17 being at the ground potential level, causing a signal becoming the ground potential to be outputted from the output terminal 13.

After a potential at each node becomes definite as described above, the inverted signal of an input signal from the input terminal 3 is outputted to the node 16 depending on whether such an input signal has the ground potential or the low potential. This causes the node 15 to have a signal at the ground potential occurring when the input signal is at the low potential level, and a signal at the high potential signal occurring when the input signal is at the ground potential level. As a result, a signal having the same phase as, but a different amplitude from, the input signal from the input terminal 3 is outputted from the output terminal 13.

As described above, the level shift circuit according to Embodiment 1 includes the level shift section 19 for receiving an input signal oscillating between the low potential level and the ground potential level at the input terminal 3 and outputting an output signal oscillating between the high potential level and the ground potential level from the node 15, the level shift section 19 being connected to the high potential power supply 1, the low potential power supply 5, and the ground potential 14, the inverter section 20 for inverting-amplifying the output signal, and the N-type MOS transistor 12 having its gate electrode connected to the low potential power supply 5. The level shift refers to the conversion of a low potential signal into a high potential signal.

The level shift section 19 includes the P-type MOS transistor 2, the P-type MOS transistor 8, the N-type MOS transistor 4, the N-type MOS transistor 9, and the inverter for receiving an input signal to the gate electrode of the N-type MOS transistor 4 and outputting the inverted signal of the input signal oscillating between the low potential level and the ground potential level to the gate electrode of the N-type MOS transistor 9, wherein the P-type MOS transistor 2 and the N-type MOS transistor 4 are connected in series between the high potential power supply and the ground potential power supply, the P-type MOS transistor 8 and the N-type MOS transistor 9 are connected in series between the high potential power supply and the ground potential power supply, the node 15 to which the P-type MOS transistor 2 and the N-type MOS transistor 4 are connected is connected to the gate electrode of the P-type MOS transistor 8 and the inverter section 20, and the node 17 to which the P-type MOS transistor 8 and the N-type MOS transistor 9 are connected is connected to the gate electrode of the P-type MOS transistor 2.

In the level shift circuit according to Embodiment 1, the high potential power supply 1 is turned on at the time T1 to cause the node 15 and the node 17 to have an intermediate potential and the high potential, respectively. The node 17 having the intermediate potential causes a signal having the high potential to be outputted from the output terminal. Then at the time T2, the low potential power supply 1 is turned on, and an input signal having the ground potential is inputted, thereby allowing a signal having the ground potential to be outputted from the output terminal.

Consequently, in the level shift circuit according to Embodiment 1, when the high potential power supply 1 is turned on first at the time T1, the N-type MOS transistor 12 becomes off due to the low potential power supply 5 being at the ground potential. As a result, no penetrating current flows in the inverter section 20. Until the low potential power supply 5 is turned on at the time T2, a signal having the high potential is outputted from the output terminal 13.

In contrast, in the level shift circuit according to Embodiment 1, when the low potential power supply 5 is turned on first at the time T1, no penetrating current flows in the inverter section 20 although the N-type MOS transistor 12 is in an on state due to the high potential power supply 1 being at the ground potential. When the low potential power supply 5 is turned on and an input signal from the input terminal 3 becomes the low potential at the time T2, a signal having the high potential from the input terminal 3 is outputted.

Embodiment 2

Embodiment 2 relates to a level shift circuit according to Embodiment 1 having a P-type MOS transistor added between a P-type MOS transistor 2 and an N-type MOS transistor 4 in a level shift section and also having a P-type MOS transistor added between a P-type MOS transistor 8 and an N-type MOS transistor 9 in the level shift section. Embodiment 2 is described below with reference to FIG. 4.

<Level Shift Circuit>

Figure 4:
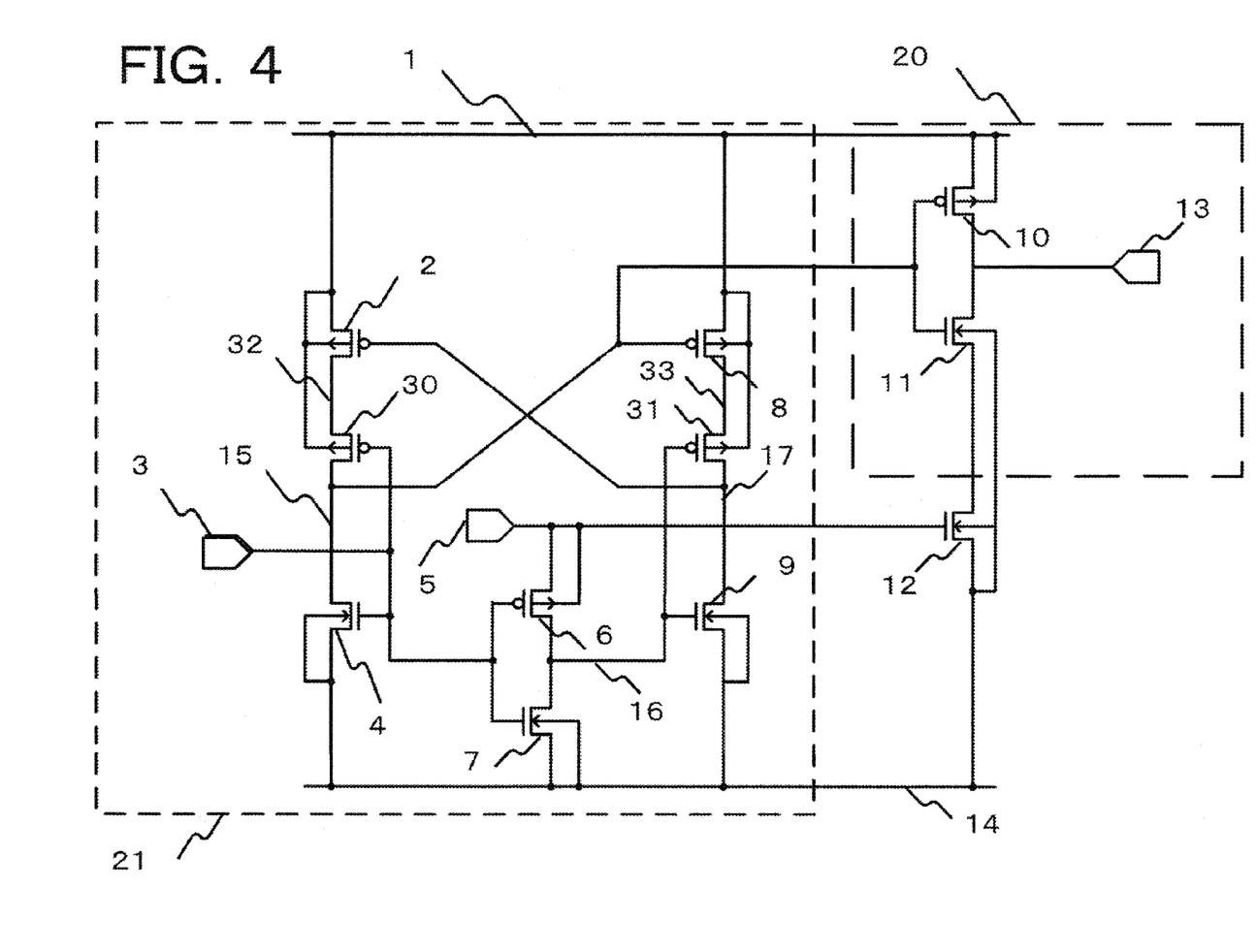
FIG. 4 is a level shift circuit according to Embodiment 2.

FIG. 4 shows a level shift circuit according to Embodiment 2. The level shift circuit according to Embodiment 2 includes a level shift section 21 that includes a level shift section 19 according to Embodiment 1 having a P-type MOS transistor 30 and a P-type MOS transistor 31 added thereto, an inverter section 20 similar to an inverter 20 according to Embodiment 1, and an N-type MOS transistor 12 connected to a ground potential power supply 14 for supplying a ground potential to the inverter section 20.

The level shift circuit 21 operates as a latch type circuit that latches a signal oscillating between a potential and the ground potential, corresponding to a low potential signal inputted from the input terminal 3 and oscillating between a low potential and the ground potential. The P-type MOS transistor 2 in the level shift 21 has its source connected to a high potential power supply 1, its drain connected to a node 32, its gate connected to a node 17, and its back gate connected to the high potential power supply 1.

The P-type MOS transistor 30 has its source connected to the node 32, its drain connected to a node 15, its gate connected to the input terminal 3, and the back gate connected to the high potential power supply 1.

The N-type MOS transistor 4 has its source connected to the ground potential power supply 14, its drain connected to the node 15, its gate connected to the input terminal 3, and the back gate connected to the low potential power supply 14. In other words, the P-type MOS transistor 2, the P-type MOS transistor 30, and the N-type MOS transistor 4 are connected in series between the high potential power supply 1 and the ground potential power supply 14.

The P-type MOS transistor 8 in the level shift section 21 has its source connected to the high potential power supply 1, its drain connected to a node 33, its gate connected to the node 15, and its back gate connected to the high potential power supply 1.

The P-type MOS transistor 31 has its source connected to the node 33, its gate connected to a node 16, and the back gate connected to the high potential power supply 1.

The N-type MOS transistor 9 has its source connected to the low potential power supply 14, its drain connected to a node 17, its gate connected to the node 16, and its back gate connected to the low potential power supply 9. In other words, the P-type MOS transistor 8, the P-type MOS transistor 31, and the N-type MOS transistor 9 are connected in series between the high potential power supply 1 and the ground potential power supply 14.

The gate of the P-type MOS transistor 2 is connected to the node 17, while the gate of the P-type MOS transistor 8 is connected to the node 15, providing a so-called cross connection.

The P-type MOS transistor 6 in the level shift section 21 has its source connected to the low potential power supply 5, its drain connected to the node 16, its gate connected to the input terminal 3, the gate of the P-type MOS transistor 7, the gate of the P-type MOS transistor 4, and the gate of the P-type MOS transistor 30, and its back gate connected to the low potential power supply 5.

The N-type MOS transistor 7 has its source connected to the ground potential power supply 14, its drain connected to the node 16, its gate connected to the input terminal 3, the gate of the P-type MOS transistor 6, the gate of the N-type MOS transistor 4, and the P-type MOS transistor 30, and its back gate connected to the low potential power supply 5. A signal inputted to the input terminal 3 is a low potential signal that oscillates between the low potential level and the ground potential level.

Accordingly, the P-type MOS transistor 6 and the N-type MOS transistor 7 form an inverting amplifying circuit, causing a signal from the input terminal 3 connected to the gate of the N-type MOS transistor 4 to be inverting-amplified and be sent to the gate of the N-type MOS transistor 9 and the P-type MOS transistor 31. Accordingly, a signal outputted to the node 16 is a low potential signal that oscillates between the low potential level and the ground potential level.

As a result, a logically inverted version of a signal from the terminal 3 is generated at the node 15, and the signal is maintained.

Also, a logically inverted version of a signal transmitted to the gate of the N-type MOS transistor 9 is generated at the node 17, and the signal is maintained. This is because the gate electrodes of the P-type MOS transistor 2 and the P-type MOS transistor 8 are cross-connected to the respective drains thereof, thereby constituting a latch circuit.

Signals at the node 15 and the node 17 are high potential signals that oscillate between the high potential level resulting from the high potential power supply 1 and the ground potential level resulting from the ground potential power supply 14.

<Operation of the Level Shift Circuit at the Time of a Power-On>

When the high potential power supply 1 is turned on first, the level shift circuit according to Embodiment 2 operates in a similar manner to the level shift circuit according to Embodiment 1. Also, when the low potential power supply 5 is turned on first, the level shift circuit according to Embodiment 2 operates in a similar manner to the level shift circuit according to Embodiment 1.

<Operation of the Level Shift Circuit when an Input Signal's Logic is Switched>

An assumption is made that an input signal to the input terminal 3 is at the ground potential, the node 16 is at the low potential, the node 15 is at the high potential, the node 17 is at the low potential, and an output signal from the output terminal 13 is at the ground potential before the logic of the input signal is switched.

When the input signal rises to the low potential from the ground potential, the level shift section 21 according to Embodiment 2 has the potential of its nodes changing as follows.

Although the input signal rising to the low potential causes the N-type MOS transistor 4 to become on, the node 17 remains at the ground potential since the node 16 takes time to have the ground potential. At that time, the P-type MOS transistor 2 is in an on state, and at the same time the N-type MOS transistor 4 is in an on state, as described above. Since the P-type MOS transistor 30 is in an off state, a current pathway through the P-type MOS transistor 2, the P-type MOS transistor 30, and the N-type MOS transistor 4 is blocked, causing no penetrating current to flow in the current pathway.

The level shift section 20 according to Embodiment 1 cannot prevent penetrating current from flowing since it does not have the P-type MOS transistor 30 for blocking the current pathway.

Subsequently, when the node 16 has the ground potential, and the node 17 has the high potential, the P-type transistor 2 becomes off and the node 15 has the ground potential. As a result, the output signal from the output terminal 13 has the high potential.

As described above, the level shift circuit according to Embodiment 2 includes the level shift section 21 for receiving an input signal oscillating between the low potential level and the ground potential level at the input terminal 3 and outputting an output signal oscillating between the high potential level and the ground potential level from the node 15, the level shift section 21 being connected to the high potential power supply 1, the low potential power supply 5, and the ground potential 14, the inverter section 20 for inverting-amplifying the output signal, and the N-type MOS transistor 12 having its gate electrode connected to the low potential power supply 5. The level shift refers to the conversion of a low potential signal into a high potential signal.

The level shift section 21 includes the P-type MOS transistor 2, the P-type MOS transistor 30, the P-type MOS transistor 31, the P-type MOS transistor 8, the N-type MOS transistor 4, and the inverter for receiving an input signal to the gate electrode of the N-type MOS transistor 30 and outputting the inverted signal of the input signal oscillating between the low potential level and the ground potential level to the gate electrode of the N-type MOS transistor 9 and the P-type transistor 31, wherein the P-type MOS transistor 2, the P-type MOS transistor 30, and the N-type MOS transistor 4 are connected in series between the high potential power supply and the ground potential power supply, the P-type MOS transistor 8, the P-type MOS transistor 31, and the N-type MOS transistor 9 are connected in series between the high potential power supply and the ground potential power supply, the node 15 to which the P-type MOS transistor 30 and the N-type MOS transistor 4 are connected is connected to the gate electrode of the P-type MOS transistor 8 and the inverter, and the node 17 to which the P-type MOS transistor 31 and the N-type MOS transistor 9 are connected is connected to the gate electrode of the P-type MOS transistor 2.

Consequently, in the level shift circuit according to Embodiment 2, when the high potential power supply 1 is turned on first at the time T1, the N-type MOS transistor 12 becomes off due to the low potential power supply 5 being at the ground potential. As a result, no penetrating current flows in the inverter section 20. Until the low potential power supply 5 is turned on at the time T2, a signal having the high potential is outputted from the output terminal 13.

In contrast, in the level shift circuit according to Embodiment 1, when the low potential power supply 5 is turned on first at the time T1, no penetrating current flows in the inverter section 20 although the N-type MOS transistor 12 is in an on state due to the high potential power supply 1 being at the ground potential. When the low potential power supply 5 is turned on and an input signal from the input terminal 3 has the low potential at the time T2, a signal having the high potential from the input terminal 3 is outputted.

In addition, the level shift circuit according to Embodiment 2 has the P-type MOS transistor 30 and the P-type MOS transistor 31 disposed in the level shift section 21, thereby preventing a penetrating current from flowing in the level shift section 21 even during normal operation.

Embodiment 3

Embodiment 3 relates to a semiconductor circuit device including an analog circuit, a logic circuit, and a level shift circuit according to Embodiment 1 or 2 for receiving a control signal from the logic circuit and outputting a signal to the analog circuit. Embodiment 3 is described below with reference to FIG. 5.

Figure 5:
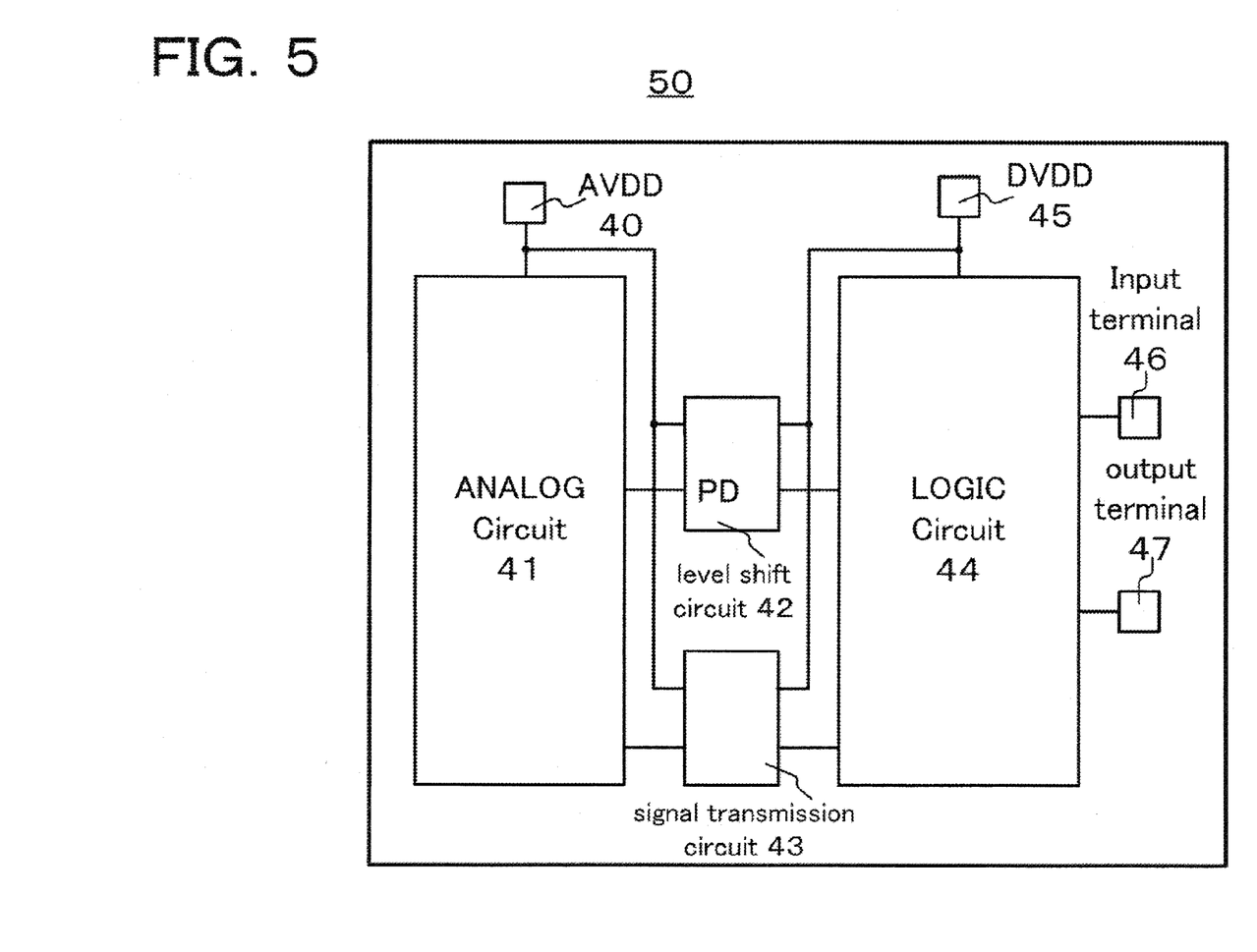
FIG. 5 shows a semiconductor circuit device 50 according to Embodiment 3.

FIG. 5 shows a semiconductor circuit device 50 according to Embodiment 3. The semiconductor circuit device 50 consists of a high potential power terminal 40 for receiving a high potential supply, an analog circuit 41, a level shift circuit 42, a signal transmission circuit 43, a logic circuit 44, a low potential power terminal 45, an input terminal 46 for receiving an input signal, and an output terminal 47 for outputting an output signal.

Although the analog circuit 41 is used in the above device, any circuit may be used if it can be driven with a high potential. Also, the logic circuit 44 is used in the above device, any circuit may be used if it can be driven with a low potential.

The high potential power terminal 40 is a terminal for receiving high potential supply from the outside of the semiconductor circuit device 50. High potential refers to, for example, a potential of 3.0V.

The analog circuit 41 is a circuit that operates in response to the above high potential. For example, the analog circuit 41 includes a circuit for converting digital signals to analog format. Analog signal refers to a signal that transmits information by the potential itself. Although the semiconductor circuit device according to Embodiment 3 does not include a terminal connected to the analog circuit 41, through which a signal is inputted/outputted from/to the outside of the semiconductor circuit device, such a terminal may be connected to the analog circuit 41.

Depending on a power down signal outputted from the logic circuit 44 or at the time of the power-on of the high potential power supply 1, the analog circuit 41 receives a high potential signal, namely, a high potential power down signal, generated by the level shift circuit 42.

In addition, the analog circuit 41 includes a power supply P-type MOS transistor having its gate receiving the above high potential power down signal, its source receiving the high potential from the high potential power terminal 40, and its drain connected to other transistors constituting the analog circuit 41.

As a result, even if the high potential is supplied to the high potential power terminal 40, the high potential supply to the analog circuit 41 through the high potential power terminal 40 is blocked when the high potential power down signal is at the high potential. Needless to say, no high potential is supplied to the analog circuit 41 irrespective of the potential of the high potential power down signal, unless the high potential is supplied to the high potential power terminal 40 from the outside.

The level shift circuit 42 is a level shift circuit according to Embodiment 1 or 2, which converts low potential signals into high potential signals when a low potential power and a high potential power are supplied to the low potential power terminal 45 and the high potential power supply 40, respectively. Level shift refers to the conversion of low potential signals to high potential signals.

In other words, the level shift circuit 42 receives from the logic circuit 44 a power down signal for controlling whether the high potential supply to the analog circuit 41 is blocked or not. Such a power down signal is the low potential signal. When the high potential is supplied to the high potential power terminal 40 and the low potential is supplied to the low potential power terminal 45, the level shift circuit 42 supplies the analog circuit 41 with the high potential signal having the same phase as the power down signal from the logic circuit 44.

Furthermore, the level shift circuit 42, as a level shift circuit according to Embodiment 1 or 2, outputs a high potential power down signal having the high potential to the analog circuit 41 when the high potential is first supplied to the high potential power terminal 40, but the low potential is not supplied to the low potential power terminal 45.

The signal transmission circuit 43 is a circuit for transmitting the high potential signal from the analog circuit to the digital circuit. For example, the signal transmission circuit 43 is an inverter operating on a low potential power supply and a ground potential power supply, consisting of an N-type MOS transistor and a P-type MOS transistor which are resistant to breakage when their gates are subjected to the high potential signal of analog signals.

The logic circuit 44 is a circuit that operates when receiving to a low potential power. For example, the logic circuit 44 is a circuit for compressing image data consisting of digital data or dealing with moving image data consisting of digital data. Digital signal refers to a signal that recognizes data at more than a predetermined potential level as "1" and those at less than a predetermined potential level as "0".

The logic circuit 44 outputs to the level shift circuit 42 a power down signal for controlling whether the high potential supply to the analog circuit 41 is blocked or not.

The low potential power terminal 45 for receiving low potential power supply is a terminal for receiving low potential supply from the outside of the semiconductor circuit device. Low potential refers to, for example, a potential of 1.8V.

The input terminal 46 for receiving an input signal is a terminal through which an input signal from the outside of the semiconductor circuit device is inputted to the logic circuit. The above input signal has, for example, amplitude between the ground potential level and 0.8V.

The output terminal 47 for outputting an output signal is a terminal through which an output signal from the logic circuit is outputted to the outside of the semiconductor circuit device. The above output signal has, for example, amplitude between the ground potential level and 1.8V.

The semiconductor circuit device according to Embodiment 3 includes a low potential power terminal, an analog circuit (circuit driven by a high potential), a logic circuit (circuit driven by a low potential), and a level shift circuit according to Embodiment 1 or 2 for level-shifting a low potential signal outputted by the logic circuit to a high potential signal and outputting it to the analog circuit.

The low potential power supply is a power supply for the logic circuit, while the high potential power supply is a power supply for the analog circuit.

The above analog circuit selectively supplies or cuts off high potential power to the analog circuit in accordance with the high potential signal supplied from the level shift circuit to the analog circuit.

In the semiconductor circuit device according to Embodiment 3, the level shift circuit 42, as a level shift circuit according to Embodiment 1 or 2, outputs a high potential power down signal having the high potential to the analog circuit 41, when the high potential is first supplied to the high potential power terminal 40, but the low potential is not supplied to the low potential power terminal 45. The analog circuit 41 includes a power supply P-type MOS transistor having its gate receiving the above high potential power down signal, its source receiving the high potential from the high potential power terminal 40, and its drain connected to other transistors constituting the analog circuit 41. As a result, the analog circuit 41 can selectively supply or cut off the high potential power to the analog circuit 41.

Consequently, no penetrating current flows in the analog circuit 41 since no high potential power is supplied to the analog circuit 41 when the high potential is first supplied to the high potential power terminal 40, but the low potential is not supplied to the low potential power terminal 45.

Also, no penetrating current flows in the analog circuit 41 since no high potential power is supplied to the analog circuit 41 when the low potential is first supplied to the low potential power terminal 45, but the high potential is not supplied to the high potential power terminal 40.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A level shift circuit comprising:
a high potential power supply for generating a high potential;
a low potential power supply for generating a low potential;
a ground potential power supply for generating a ground potential;
a level shift section for receiving a low potential signal oscillating between the low potential and the ground potential, and converting the low potential signal into a high potential signal oscillating between the high potential and the ground potential;
an inverter section for inverting-amplifying the high potential signal from the level shift section, the inverter section including two transistors;
an N-type MOS transistor for supplying the ground potential to the inverter section, the N-type MOS transistor being connected in series to the inverter section between the high potential power supply and the ground potential power supply, and having its gate electrode directly connected to the low potential power supply; and
an output signal line connected to an output node between a drain of each of the two transistors in the inverter section.

2. The level shift circuit according to claim 1,
wherein the level shift section comprises a first P-type MOS transistor, a second P-type MOS transistor, a first N-type MOS transistor, a second N-type MOS transistor, and an inverter for receiving the low potential signal connected to a gate electrode of the first N-type MOS transistor and outputting an inverted signal of the low potential signal to a gate electrode of the second N-type MOS transistor;
wherein the first P-type MOS transistor and the first N-type MOS transistor are connected in series between the high potential power supply and the ground potential power supply;
wherein the second P-type MOS transistor and the second N-type MOS transistor are connected in series between the high potential power supply and the ground potential power supply;
wherein a first node to which the first P-type MOS transistor and the first N-type MOS transistor are connected is connected to a gate electrode of the second P-type MOS transistor and the inverter section; and
wherein a second node to which the second P-type MOS transistor and the second N-type MOS transistor are connected is connected to a gate electrode of the first P-type MOS transistor.

3. A level shift circuit comprising:
a high potential power supply for generating a high potential;
a low potential power supply for generating a low potential;
a ground potential power supply for generating a ground potential;
a level shift section for receiving a low potential signal oscillating between the low potential and the ground potential, and converting the low potential signal into a high potential signal oscillating between the high potential and the ground potential;
an inverter section for inverting-amplifying the high potential signal from the level shift section, the inverter section including two transistors;
an N-type MOS transistor for supplying the ground potential to the inverter section, the N-type MOS transistor being connected in series to the inverter section between the high potential power supply and the ground potential power supply, and having its gate electrode connected to the low potential power supply,
wherein the level shift section comprises a first P-type MOS transistor, second P-type MOS transistor, a third P-type MOS transistor, a fourth P-type MOS transistor, a first N-type MOS transistor, a second N-type MOS transistor, and an inverter for receiving the low potential signal connected to a gate electrode of the first N-type MOS transistor and a gate electrode of the third P-type MOS transistor and outputting an inverted signal of the low potential signal to a gate electrode of the second N-type MOS transistor and a gate electrode of the fourth P-type MOS transistor; and
an output signal line connected to an output node between a drain of each of the two transistors in the inverter section,
wherein the first P-type MOS transistor, the third P-type MOS transistor, and the first N-type MOS transistor are connected in series between the high potential power supply and the ground potential power supply;
wherein the second P-type MOS transistor, the fourth P-type MOS transistor, and the second N-type MOS transistor are connected in series between the high potential power supply and the ground potential power supply;

wherein a first node to which the third P-type MOS transistor and the first N-type MOS transistor are connected is connected to a gate electrode of the second P-type MOS transistor and the inverter section; and wherein a second node to which the fourth P-type MOS transistor and the second N-type MOS transistor are connected is connected to a gate electrode of the first P-type MOS transistor.

4. A semiconductor circuit device comprising:
a level shift circuit having:
    a high potential power supply for generating a high potential;
    a low potential power supply for generating a low potential;
    a ground potential power supply for generating a ground potential;
    a level shift section for receiving a low potential signal oscillating between the low potential and the ground potential, and converting the low potential signal into a high potential signal oscillating between the high potential and the ground potential;
    an inverter section for inverting-amplifying the high potential signal from the level shift section, the inverter section including two transistors; and
    an N-type MOS transistor for supplying the ground potential to the inverter section, the N-type MOS transistor being connected in series to the inverter section between the high potential power supply and the ground potential power supply, and having its gate electrode directly connected to the low potential power supply;
an output signal line connected to an output node between a drain of each of the two transistors in the inverter section;
a low potential power terminal connected to a low potential power supply;
a high potential power terminal connected to a high potential power supply;
a circuit driven with a high potential; and
a circuit, driven with a low potential;
wherein a high potential signal generated by level-shifting a low potential signal outputted from the circuit driven by the low potential is outputted to the circuit driven with the high potential.

5. The semiconductor circuit device according to claim 4, wherein the level shift section comprises a first P-type MOS transistor, a second P-type MOS transistor, a first N-type MOS transistor, a second N-type MOS transistor, and an inverter for receiving the low potential signal connected to a gate electrode of the first N-type MOS transistor and outputting an inverted signal of the low potential signal to a gate electrode of the second N-type MOS transistor;

wherein the first P-type MOS transistor and the first N-type MOS transistor are connected in series between the high potential power supply and the ground potential power supply;

wherein the second P-type MOS transistor and the second N-type MOS transistor are connected in series between the high potential power supply and the ground potential power supply;

wherein a first node to which the first P-type MOS transistor and the first N-type MOS transistor are connected is connected to a gate electrode of the second P-type MOS transistor and the inverter; and wherein a second node to which the second P-type MOS transistor and the second N-type MOS transistor are connected is connected to a gate electrode of the first P-type MOS transistor.

6. A semiconductor circuit device comprising:
a level shift circuit having:
    a high potential power supply for generating a high potential;
    a low potential power supply for generating a low potential;
    a ground potential power supply for generating a ground potential;
    a level shift section for receiving a low potential signal oscillating between the low potential and the ground potential, and converting the low potential signal into a high potential signal oscillating between the high potential and the ground potential;
    an inverter section for inverting-amplifying the high potential signal from the level shift section, the inverter section including two transistors; and
    an N-type MOS transistor for supplying the ground potential to the inverter section, the N-type MOS transistor being connected in series to the inverter section between the high potential power supply and the ground potential power supply, and having its gate electrode connected to the low potential power supply;
an output signal line connected to an output node between a drain of each of the two transistors in the inverter section;
a low potential power terminal connected to a low potential power supply;
a high potential power terminal connected to a high potential power supply;
a circuit driven with a high potential; and
a circuit driven with a low potential;
wherein a high potential signal generated by level-shifting a low potential signal outputted from the circuit driven by the low potential is outputted to the circuit driven with the high potential,
wherein the level shift section comprises a first P-type MOS transistor, a second P-type MOS transistor, a third P-type MOS transistor, a fourth P-type MOS transistor, a first N-type MOS transistor, a second N-type MOS transistor, and an inverter for receiving the low potential signal connected to a gate electrode of the first N-type MOS transistor and a gate electrode of the third P-type MOS transistor and outputting an inverted signal of the low potential signal to a gate electrode of the second N-type MOS transistor and a gate electrode of the fourth P-type MOS transistor;
wherein the first P-type MOS transistor, the third P-type MOS transistor, and the first N-type MOS transistor are connected in series between the high potential power supply and the ground potential power supply;
wherein the second P-type MOS transistor, the fourth P-type MOS transistor, and the second N-type MOS transistor are connected in series between the high potential power supply and the ground potential power supply;
wherein a first node to which the third P-type MOS transistor and the first N-type MOS transistor are connected is connected to a gate electrode of the second P-type MOS transistor and the inverter section; and wherein a second node to which the fourth P-type MOS transistor and the second N-type MOS transistor are connected is connected to a gate electrode of the first P-type MOS transistor.

7. The semiconductor circuit device according to claim 6, wherein the low potential power supply is a power supply for a circuit driven with the low potential supplied from outside; and
wherein the high potential power supply is a power supply for a circuit driven with the high potential supplied from outside.

8. The semiconductor circuit device according to claim 6, wherein the circuit driven with the high potential is an analog circuit, and the circuit driven with the low potential is a logic circuit.

9. The semiconductor circuit device according to claim 8, wherein the analog circuit selectively supplies or cuts off the high potential power supply to the analog circuit in accordance with the high potential signal from the level shift circuit.

\* \* \* \* \*